(12) United States Patent  (10) Patent No.: US 7,834,457 B2
Yang et al.  (45) Date of Patent: Nov. 16, 2010

(54) BILAYER METAL CAPPING LAYER FOR INTERCONNECT APPLICATIONS

(75) Inventors: Chih-Chao Yang, Glenmont, NY (US); Satya V. Nitta, Poughquag, NY (US)

(73) Assignee: International Business Machines Corporation, Armonk, NY (US)

( * ) Notice: Subject to any disclaimer, the term of this patent is extended or adjusted under 35 U.S.C. 154(b) by 99 days.

(21) Appl. No.: 12/039,280

(22) Filed: Feb. 28, 2008

(65) Prior Publication Data

US 2009/0218691 A1    Sep. 3, 2009

(51) Int. Cl.
*H01L 21/768* (2006.01)

(52) U.S. Cl. ............... 257/751; 257/758; 257/E21.576; 438/653

(58) Field of Classification Search ........... 257/751, 257/758, E23.269, E21.576; 438/653
See application file for complete search history.

(56) References Cited

U.S. PATENT DOCUMENTS

| | | | |
|---|---|---|---|
| 5,098,860 A | 3/1992 | Chakravorty et al. | |
| 5,585,673 A | 12/1996 | Joshi et al. | |
| 5,695,810 A | 12/1997 | Dubin et al. | |
| 5,930,669 A | 7/1999 | Uzoh | |
| 5,933,753 A | 8/1999 | Simon et al. | |
| 6,323,554 B1 | 11/2001 | Joshi et al. | |
| 6,342,733 B1 | 1/2002 | Hu et al. | |
| 6,383,920 B1 | 5/2002 | Wang et al. | |
| 6,429,519 B1 | 8/2002 | Uzoh | |
| 6,528,409 B1 | 3/2003 | Lopatin et al. | |
| 6,706,625 B1 * | 3/2004 | Sudijono et al. | 438/637 |
| 6,943,096 B1 * | 9/2005 | Wang et al. | 438/484 |
| 2004/0113279 A1 | 6/2004 | Chen et al. | |
| 2005/0001325 A1 | 1/2005 | Andricacos et al. | |
| 2005/0112864 A1 * | 5/2005 | Clevenger et al. | 438/622 |
| 2005/0112957 A1 * | 5/2005 | Yang et al. | 439/758 |
| 2006/0121733 A1 | 6/2006 | Kilpela et al. | |
| 2006/0163739 A1 | 7/2006 | Komai et al. | |
| 2006/0216929 A1 | 9/2006 | Park et al. | |
| 2006/0237853 A1 | 10/2006 | Nogami | |

* cited by examiner

*Primary Examiner*—Thinh T Nguyen
(74) *Attorney, Agent, or Firm*—Scully, Scott, Murphy & Presser, P.C.; Louis J. Percello, Esq,

(57) ABSTRACT

The invention provides semiconductor interconnect structures that have improved reliability and technology extendibility. In the present invention, a second metallic capping layer is located on a surface of a first metallic cap layer which is, in turn, located on a surface of the conductive feature embedded within a first dielectric material. Both the first and second metallic capping layers are located beneath an opening, e.g., a via opening, the is present within an overlying second dielectric material. The second metallic capping layer protects the first dielectric capping layer from being removed (either completely or partially) during subsequent processing steps. Interconnect structures including via gouging features as well as non-via gouging features are disclosed. The present invention provides methods of fabricating such semiconductor interconnect structures.

13 Claims, 6 Drawing Sheets

BILAYER METAL CAPPING LAYER FOR INTERCONNECT APPLICATIONS

FIELD OF THE INVENTION

The present invention relates to a semiconductor interconnect structure and a method of fabricating the same. More particularly, the present invention relates to a semiconductor interconnect structure in which a bilayer metal capping layer is present within the interconnect structure. The present invention also provides a method of fabricating a semiconductor interconnect structure including a bilayer metal capping layer.

BACKGROUND OF THE INVENTION

Generally, semiconductor devices include a plurality of circuits which form an integrated circuit (IC) fabricated on a semiconductor substrate. A complex network of signal paths will normally be routed to connect the circuit elements distributed on the surface of the substrate. Efficient routing of these signals across the device requires formation of multi-level or multilayered schemes, such as, for example, single or dual damascene wiring structures. The wiring structure typically includes copper, Cu, since Cu based interconnects provide higher speed signal transmission between large numbers of transistors on a complex semiconductor chip as compared with aluminum, Al, based interconnects.

Within a typical interconnect structure, metal vias run perpendicular to the semiconductor substrate and metal lines run parallel to the semiconductor substrate. Further enhancement of the signal speed and reduction of signals in adjacent metal lines (known as "crosstalk") are achieved in today's IC product chips by embedding the metal lines and metal vias (e.g., conductive features) in a dielectric material having a dielectric constant of less than 4.0.

In semiconductor interconnect structures, electromigration (EM) has been identified as one metal failure mechanism. EM is one of the worst reliability concerns for very large scale integrated (VLSI) circuits. The problem not only needs to be overcome during the process development period in order to qualify the process, but it also persists through the lifetime of the chip. Voids are created inside the metal conductor of an interconnect structure due to metal ion movement caused by the high density of current flow.

Although the fast diffusion path in metal interconnects varies depending on the overall integration scheme and materials used for chip fabrication, it has been observed that metal atoms, such as Cu atoms, transported along the metal/post planarized dielectric cap interface play an important role on the EM lifetime projection. The EM initial voids first nucleate at the metal/dielectric cap interface and then grow in the direction of the bottom of the interconnect, which eventually results in a circuit dead opening.

FIGS. 1A-1D are pictorial representations of a prior art interconnect structure at various stages of EM failure. In these drawings, reference numeral 12 denotes the dielectric cap, and reference numeral 10 denotes the conductive feature typically comprised of Cu or some other conductive metal; all other components of the prior art interconnect structure are not labeled to avoid obscuring the EM problem. FIG. 1A is at an initial stress stage. FIG. 1B is at a time when void 14 nucleation initiates at the conductive feature 10 dielectric cap 12 interface. FIG. 1C is at a time when the void 14 grows toward the bottom of the conductive feature 10, and FIG. 1D is at a time in which the void 14 growth crosses the conductive feature 10 causing a circuit dead opening.

In the prior art, two types of capping layers are used for protecting the conductive features of an interconnect structure. One type of capping layer includes a dielectric capping material, while the other type of capping layer includes a metallic capping material. Although both types of capping layers are available, the metallic capping layer typically has better (i.e., increased) adhesion strength to the underlying conductive feature as compared to that obtained using a dielectric capping layer.

The increased adhesion strength provided at the conductive feature/metallic capping layer interface results in improved EM resistance as compared to cases when a dielectric capping layer is employed. For example, the selective deposition of a Co alloy on a conductive feature comprised of Cu has been demonstrated to have a greater than 10 times EM resistance than an interconnect structure including a standard dielectric capping layer.

Despite providing better adhesion and increased EM resistance, prior art metallic capping layers can be attacked or removed (either partially or completely) during a subsequent etching process used in forming an upper interconnect level of an interconnect structure. For example, CoWP metallic capping layers may be damaged or removed (partially or completely) by a subsequent etching step using dilute hydrofluoric acid (DHF) as a chemical etchant.

The attack or removal (partial or complete) of the metallic capping layer in an interconnect structure is undesirable in that it leads to increased EM within the interconnect structure. It is observed that the removal of prior art metallic capping layers is in both the lateral direction and the vertical direction.

In view of the drawbacks mentioned above with prior interconnect structures, there is a need for providing improved interconnect structures in which EM is reduced or completely eliminated. Moreover, there is a need for providing an interconnect structure in which a new and improved metal capping layer is employed which avoids the problems mentioned above with conventional metallic capping layers.

SUMMARY OF THE INVENTION

The present invention provides semiconductor interconnect structures that have improved reliability and technology extendibility. In the present invention, a second metallic capping layer is selectively located on a surface of a first metallic cap layer which is, in turn, selectively located on a surface of the conductive feature embedded within a first dielectric material. Both the first and second metallic capping layers are located beneath an opening, e.g., a via opening, that is present within an overlying second dielectric material. The second metallic capping layer protects the first metallic capping layer from being removed (either completely or partially) during subsequent processing steps. Interconnect structures including via gouging features as well as non-via gouging features are disclosed. The present invention provides methods of fabricating such semiconductor interconnect structures which are compatible with existing semiconductor interconnect processing steps.

In general terms, the present invention provides a semiconductor structure that comprises:

a first interconnect level including a first dielectric material having at least one conductive feature embedded therein, said at least one conductive feature has an upper surface in which at least some portions thereof are protected by an overlying first metallic capping layer;

a dielectric capping layer located on a surface of said first dielectric material and a surface of said first metallic capping layer;

a second interconnect level including a second dielectric material having at least one conductively filled opening punched through said dielectric capping layer and located on an upper surface of said first metallic capping layer; and a second metallic capping layer located at a bottom portion of said at least one conductively filled opening and on at least some portion of said first metallic capping layer, said second metallic capping layer is comprised of a different metal than said first metallic capping layer.

In some embodiments of the invention, the conductive feature within the first dielectric material does not include a via gouged feature. When a non-via gouged feature is present, no portions of the second metallic capping layer and the first metallic capping layer are removed. In yet other embodiments of the invention, the conductive feature within the first dielectric material includes a via gouged feature. When a via gouged feature is present, a central portion of the second metallic capping layer and an underlying portion of the first metallic capping layer that are not protected by an overlying Cu diffusion barrier liner are removed. That is, after forming the via gouging feature, the remaining portions of the first and second metallic capping layers do not extend beyond the edges of the overlying patterned, i.e., opened, dielectric capping layer.

In a highly preferred aspect of the invention, a semiconductor structure is provided that comprises:

a first interconnect level including a first dielectric material having at least one Cu-containing feature embedded therein, said at least one Cu-containing conductive feature has an upper surface in which at least some portions thereof are protected by an overlying Co-containing metallic capping layer;

a dielectric capping layer located on said first dielectric material and some, but not all portions of the Co-containing metallic capping layer;

a second interconnect level including a second dielectric material having at least one Cu-containing filled opening punched through said dielectric capping layer and located on an upper surface of said first metallic capping layer; and a Ru-containing metallic capping layer located at a bottom portion of said Cu-containing filled opening and on at least some portion of said Co-containing metallic capping layer.

In addition to providing semiconductor structures, the present invention also provides methods of forming the same. The inventive methods include processing steps that are compatible with current interconnect processing steps, as such, the inventive methods can be easily integrated into existing interconnect processing.

In general terms, the method of the present invention comprises:

providing a semiconductor structure including a first interconnect level comprising at least one conductive feature embedded within a first dielectric material, said at least one conductive feature including a first metallic capping layer located thereon;

forming a patterned material stack including a dielectric capping layer on exposed surfaces of said first dielectric material and said first metallic capping layer, and a second dielectric material having at least one opening located therein, said at least one opening exposes a surface of said first metallic capping layer;

forming a second metallic capping layer on said exposed surface of said first metallic capping layer, said second metallic capping layer comprising a metal that is different from a metal present in said first metallic capping layer; and filling said at least one opening within at least an interconnect conductive material.

In some embodiments of the invention, the conductive feature within the first dielectric material does not include a via gouged feature. When a non-via gouged feature is present, no portions of the second metallic capping layer and the first metallic capping layer are removed. In yet other embodiments of the invention, the conductive feature within the first dielectric material includes a via gouged feature. When a via gouged feature is present, a central portion of the second metallic capping layer and an underlying portion of the first metallic capping layer that are not protected by an overlying Cu diffusion barrier liner are removed. That is, after forming the via gouging feature, the remaining portions of the first and second metallic capping layers do not extend beyond the edges of the overlying patterned, i.e., opened, dielectric capping layer.

DETAILED DESCRIPTION OF THE INVENTION

The present invention, which provides interconnect structures having technology extendibility and high reliability and methods of fabricating the same, will now be described in greater detail by referring to the following discussion and drawings that accompany the present application. It is noted that the drawings of the present application are provided for illustrative purposes only and, as such, the drawings are not drawn to scale.

In the following description, numerous specific details are set forth, such as particular structures, components, materials, dimensions, processing steps and techniques, in order to provide a thorough understanding of the present invention. However, it will be appreciated by one of ordinary skill in the art that the invention may be practiced without these specific details. In other instances, well-known structures or processing steps have not been described in detail in order to avoid obscuring the invention.

It will be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Reference is now made to FIGS. 2-9 which illustrate the basic processing steps employed in one embodiment of the present invention. In the embodiment illustrated, the inventive bilayer metallic capping layer is used in an interconnect structure in which no via gouging feature is present. FIG. 10, which will be described in greater detail herein below, illustrates an alternative embodiment of the present invention in which the inventive bilayer metallic capping layer is present in an interconnect structure in which a via gouging feature is present.

Figure 1A:
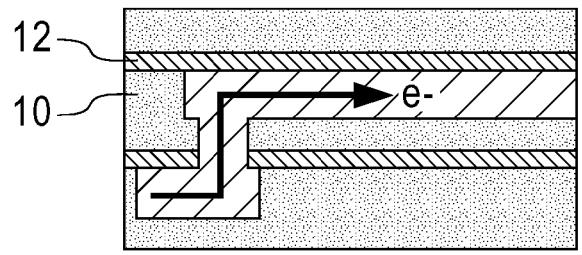
FIGS. 1A-1D are pictorial representations (through cross sectional views) illustrating the formation of a dead circuit in a prior interconnect structure which is caused by EM failure.
Figure 1B:
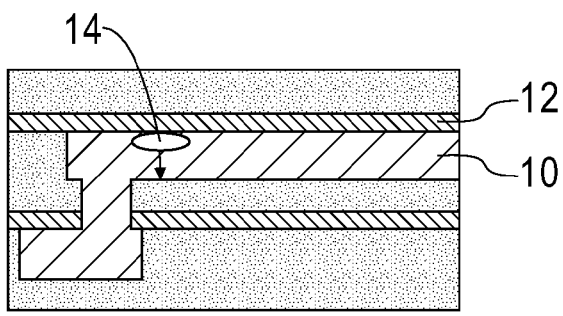
Figure 1C:
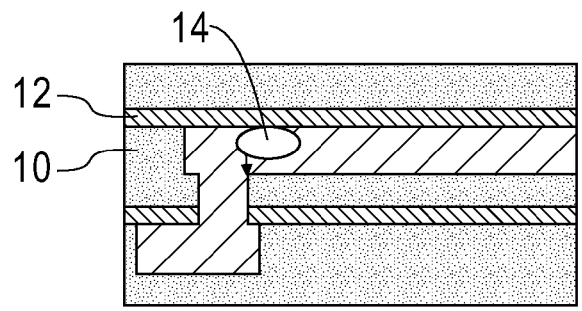
Figure 1D:
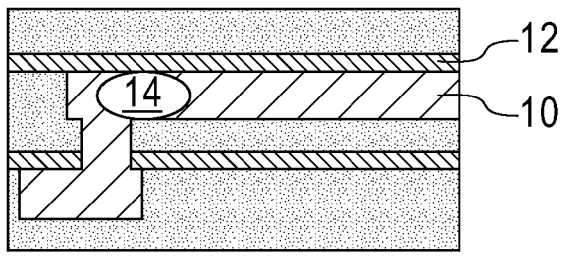
Figure 2:
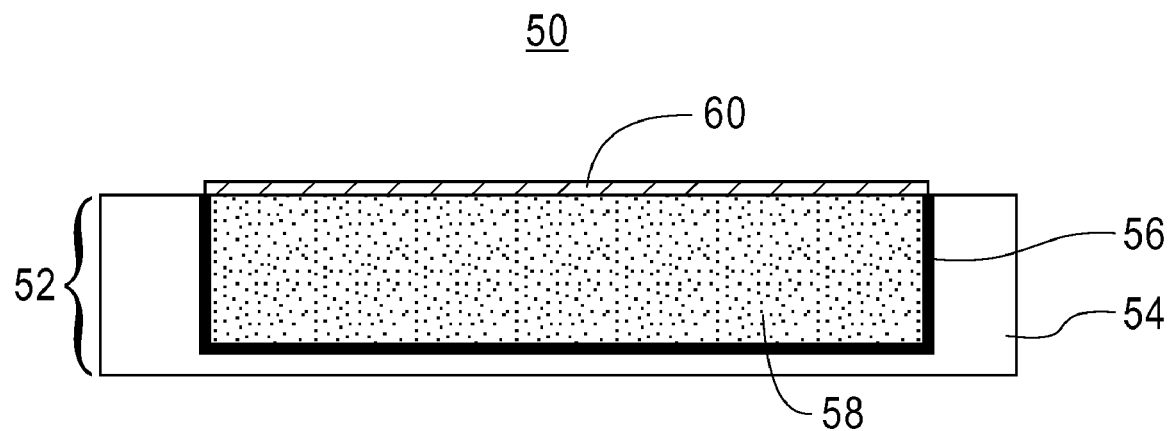
FIGS. 2-9 are pictorial representations (through cross sectional views) illustrating the basic processing steps employed in one embodiment of the present invention.

The method of the present invention begins by providing the initial structure 50 illustrated in FIG. 2. As shown, the initial structure 50 includes a first interconnect level 52 of an interconnect structure comprising a first dielectric material 54 having a least one conductive feature 58 embedded therein which is separated from the first dielectric material 54 by a first diffusion barrier 56. The initial structure 50 shown in FIG. 2 also includes a first metallic capping layer 60 disposed on an exposed upper surface of the at least one conductive feature 58; some of the first metallic capping layer 60 may extend onto the first diffusion barrier 56, but it does not extend onto the surface of the first dielectric material 54.

The initial structure 50 shown in FIG. 2 is typically located on a surface of a substrate (not shown). The substrate, which is not shown, may comprise a semiconducting material, an insulating material, a conductive material or any combination thereof. When the substrate is comprised of a semiconducting material, any semiconductor such as Si, SiGe, SiGeC, SiC, Ge alloys, GaAs, InAs, InP and other III/V or II/VI compound semiconductors may be used. In addition to these listed types of semiconducting materials, the present invention also contemplates cases in which the semiconductor substrate is a layered semiconductor such as, for example, Si/SiGe, Si/SiC, silicon-on-insulators (SOIs) or silicon germanium-on-insulators (SGOIs).

When the substrate is an insulating material, the insulating material can be an organic insulator, an inorganic insulator or a combination thereof including multilayers. When the substrate is a conducting material, the substrate may include, for example, polySi, an elemental metal, alloys of elemental metals, a metal silicide, a metal nitride or combinations thereof including multilayers. When the substrate comprises a semiconducting material, one or more semiconductor devices such as, for example, complementary metal oxide semiconductor (CMOS) devices can be fabricated thereon.

The first dielectric material 54 comprises any interlevel or intralevel dielectric including inorganic dielectrics or organic dielectrics. The first dielectric material 54 may be porous or non-porous. Some examples of suitable dielectrics that can be used as the first dielectric material 54 include, but are not limited to: $SiO_2$, silsesquioxanes, C doped oxides (i.e., organosilicates) that include atoms of Si, C, O and H, thermosetting polyarylene ethers, or multilayers thereof. The term "polyarylene" is used in this application to denote aryl moieties or inertly substituted aryl moieties which are linked together by bonds, fused rings, or inert linking groups such as, for example, oxygen, sulfur, sulfone, sulfoxide, carbonyl and the like.

The first dielectric material 54 typically has a dielectric constant that is about 4.0 or less, with a dielectric constant of about 2.8 or less being even more typical. These dielectrics generally have a lower parasitic crosstalk as compared with dielectric materials that have a higher dielectric constant than 4.0. The thickness of the first dielectric material 54 may vary depending upon the dielectric material used as well as the exact number of dielectrics within the layer. Typically, and for normal interconnect structures, the first dielectric material 54 has a thickness from about 200 to about 450 nm.

The first dielectric material 54 is formed on the substrate (not shown) utilizing any conventional deposition process including, for example, chemical vapor deposition (CVD), plasma enhanced chemical vapor deposition (PECV)), evaporation, chemical solution deposition and spin-on coating.

Following the formation of the first dielectric material 54 on a substrate (not shown), the first dielectric material 54 is patterned by lithography (applying a photoresist, exposing the applied photoresist to a desired pattern of radiation and development) and etching (dry etching, wet etching or a combination thereof) to provide at least one opening within the first dielectric material 54 in which the at least one conductive feature 58 will be subsequently formed. The patterning of the first dielectric material 54 may occur with a hard mask (not shown) located on the upper surface of the first dielectric material 52. The hard mask (not shown) is typically removed after filling the at least one opening with a conductive material and subjecting the structure to planarization. During the etching process, the patterned photoresist can be removed (via a conventional stripping process) after transferring the pattern into at least the hard mask.

Next, a first diffusion barrier 56 is formed on the exposed wall portions of the first dielectric material 54 within the at least one opening. The first diffusion barrier 56 comprises one of Ta, TaN, TiN, Ru, RuN, RuTa, RuTaN, W, WN and any other material that can serve as a barrier to prevent conductive material from diffusing there through. The thickness of the first diffusion barrier 56 may vary depending on the deposition process used in forming the same as well as the material employed. Typically, the first diffusion barrier 56 has a thickness from about 4 to about 40 nm, with a thickness from about 7 to about 20 nm being more typical.

The first diffusion barrier 56 is formed by a conventional deposition process including, for example, CVD, PECVD, atomic layer deposition (ALD), physical vapor deposition (PVD), sputtering, chemical solution deposition and plating.

After lining the opening with the first diffusion barrier 56, a conductive feature 58 is formed within the opening by depositing a conductive material within the opening and planarizing the structure. The planarization provides a structure in which the upper surfaces of at least the conductive feature 58 is substantially coplanar with an upper surface of the first dielectric material 54.

The conductive material which is used in forming the at least one conductive feature 58 includes, for example, polySi, a conductive metal, an alloy comprising at least one conductive metal, a conductive metal silicide or combinations thereof. Preferably, the conductive material that is used in forming the at least one conductive feature 58 is a conductive metal such as Cu, W or Al, with Cu or a Cu alloy (such as AlCu) being highly preferred in the present invention. The conductive material is filled into the remaining portions of the least one opening in the first dielectric material 54 utilizing a conventional deposition process including, but not limited to: CVD, PECVD, sputtering, chemical solution deposition or plating.

After deposition, a conventional planarization process such as, for example, chemical mechanical polishing (CMP) and/or grinding can be used to provide a structure in which the first diffusion barrier 56 and the at least one conductive feature 58 each have an upper surface that is substantially coplanar with the upper surface of the first dielectric material 54.

Next, a first metallic capping layer 60 is formed on the upper exposed surface of at least the conductive feature 58, i.e., atop the conductive material within the first dielectric material 54. The first metallic capping layer 60 comprises Co, Ir or Ru alone, or their alloy materials with at least one of W, B, P, Mo and Re. That is, one of Co, Ir and Ru with at least one of W, B, P, Mo and Re. Preferably, the first metallic capping layer 60 comprises a Co-containing metallic capping layer, with CoWP being highly preferred. The first metallic capping layer 60 has a thickness that is typically within a range from about 2 to about 20 nm, with a thickness range from about 5 to about 10 nm being even more typical.

The first metallic capping layer 60 is typically, but not necessary always, formed utilizing a selective deposition process including for example, a catalytic plating process and an electroless plating process. In some embodiments, a non-selective deposition process such as sputtering, atomic layer deposition (ALD) and CVD can be used.

It is observed that the first metallic capping layer 60 is not coplanar to an upper surface of the first dielectric material 54. Instead, the first metallic capping layer 60 has an upper surface that is located above the upper surface of the first dielectric material 54. As such, the conductive feature 58 is not a recessed conductive feature.

Figure 3:
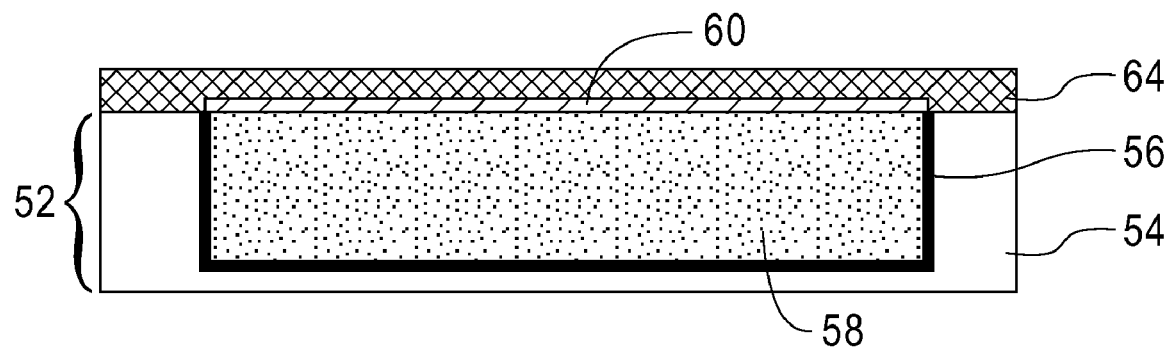

FIG. 3 shows the resultant structure that is formed after a dielectric capping layer 64 is formed. The dielectric capping layer 64 covers the upper exposed surface of the first dielectric material 54 as well as the metallic capped conductive feature (that is, the dielectric capping layer also is located atop the first metallic capping layer 60).

The dielectric capping layer 64 is formed utilizing a conventional deposition process such as, for example, CVD, PECVD, and spin-on coating. The dielectric capping layer 64 comprises any suitable dielectric capping material such as, for example, SiC, $Si_4NH_3$, $SiO_2$, a carbon doped oxide, a nitrogen and hydrogen doped silicon carbide SiC(N,H) or multilayers thereof. The thickness of the dielectric capping layer 64 may vary depending on the technique used to form the same as well as the material make-up of the layer. Typically, the dielectric capping layer 64 has a thickness from about 15 to about 55 nm, with a thickness from about 25 to about 45 nm being more typical.

Figure 4:
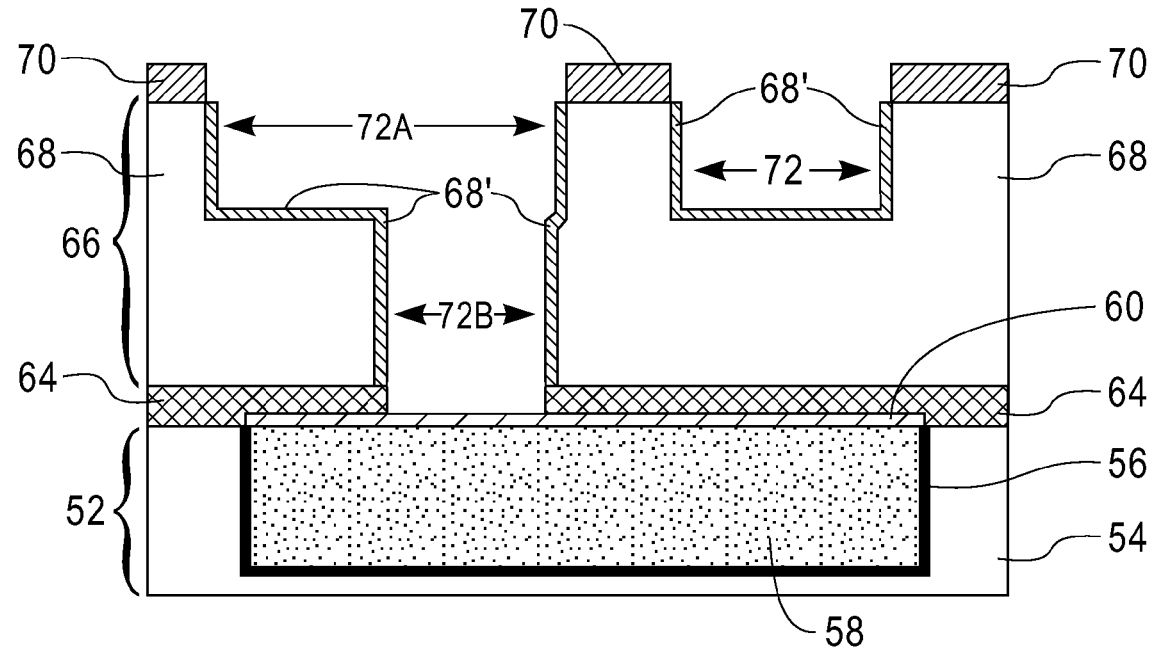

In FIG. 4, a second dielectric material 68, which forms part of a second interconnect level 66 of the inventive structure, is the formed on the upper exposed surface of the dielectric capping layer 64. The second dielectric material 68 may comprise the same or different, preferably the same, dielectric material as that of the first dielectric material 54. The processing techniques and thickness ranges for the first dielectric material 54 are also applicable here for the second dielectric material. The second dielectric material 68 can also comprise two different materials, i.e., deposition of one dielectric material first, followed by deposition of a different dielectric material. In one embodiment of the present invention, the second dielectric material 68 comprises two different low k dielectric materials and thus the second interconnect level 66 has a hybrid structure with the subsequently filled conductively filled line embedded in a porous dielectric material, and the subsequently filled via embedded in a dense (i.e., non porous) dielectric material. In such an embodiment, the porous low k dielectric has a dielectric constant of about 2.8 or less, and the dense porous low k dielectric has a dielectric constant of about 4.0 or less.

After forming the second dielectric material 68 on the dielectric capping layer 64, a hard mask 70 is formed on the upper surface of the second dielectric material 68. The hard mask 70 comprises an oxide, nitride, oxynitride or multilayered stacks thereof. In one embodiment, the hard mask 70 is comprised of silicon oxide. In another embodiment, the hard mask 70 is comprised of silicon nitride. In yet another embodiment of the present invention, the hard mask 70 is comprised of a pad stack comprising a layer of silicon oxide, and a layer of silicon nitride located atop the layer of silicon oxide. The bard mask 70 can be formed utilizing a thermal growth process including, for example, oxidation, nitridation and combinations thereof. Alternatively, the hard mask 70 can be formed by a deposition process including, for example, chemical vapor deposition, plasma enhanced chemical vapor deposition, chemical solution deposition, atomic layer deposition and evaporation.

The thickness of the as-deposited hard mask 70 may vary depending upon the type of hard mask material formed, the number of layers that make up the hard mask and the deposition technique used in forming the same. Typically, the as-deposited hard mask 70 has a thickness from about 10 to about 80 nm, with a thickness from about 20 to about 60 nm being even more typical.

After forming the blanket layer of hard mask 70 on the surface of the second dielectric material 68, a single or dual damascene process is used to create openings (vias, lines or combinations of vias and lines) within the second dielectric material 68. Combined lines and vias are typically formed when a dual damascene process is used, while a line opening or via opening is formed when a single damascene process is used.

FIG. 4 illustrates one embodiment of the invention in which a dual damascene process is used to provide a structure wherein the second dielectric material 68 includes a combination of a line opening 72A and a via opening 7213 as well as an another line opening 72. It is observed that in FIG. 4, the line opening 72A is located atop and adjoining the via opening 72B.

Single damascene and dual damascene processes are well known to those in the art therefore the details concerning these processes are not provided herein. It is, however, noted that in single and dual damascene processes lithography and etching are used in forming the openings. Lithography includes applying a photoresist (not shown) atop the hard mask 70 utilizing a conventional deposition process such as, for example, CVD, PECVD, spin-on coating, chemical solution deposition or evaporation. The photoresist may be a positive-tone material, a negative-tone material or a hybrid material, each of which is well known to those skilled in the art. The photoresist is then subjected to a lithographic process which includes exposing the photoresist to a pattern of radiation and developing the exposed resist utilizing a conventional resist developer. The lithographic step provides a patterned photoresist atop the hard mask that defines the width of the opening to be subsequently formed into the second dielectric material. After providing the patterned photoresist, the pattern is transferred into the hard mask and then subsequently into the second dielectric material utilizing one or more etching processes. The patterned photoresist can be stripped immediately after the pattern is transferred into the hard mask forming a patterned hard mask utilizing a conventional stripping process. Alternatively, the patterned photoresist can be stripped after the pattern is transferred into the second dielectric material. The etching used in transferring the pattern may comprise a dry etching process, a wet chemical etching process or a combination thereof. The term "dry etching" is used herein to denote an etching technique such as reactive-ion etching, ion beam etching, plasma etching or laser ablation. When dual damascene is used another iteration of patterning the second dielectric material is performed. Note that in a dual damascene process via openings are typically, but not necessarily always, formed prior to the line openings.

It is observed that during the formation of the openings within the second dielectric material 68, one of the etching steps also removes a portion of the dielectric capping layer 64 that is located atop the conductive feature 58 embedded within the first dielectric material 54, while stopping atop the first metallic capping layer 60.

It is further observed that during the formation of the openings into the second dielectric material 68 the sidewalls of the second dielectric material 68 are damaged forming damaged sidewalls 68'. The damaged sidewalls 68' are also depicted, for example, in FIG. 4. The damaged sidewalls 68' are less dense as compared to the bulk material. This could be either chemical or physical in nature. For example, and when the second dielectric material 68 includes C as one of the atoms, the damaged sidewalls 68' of the second dielectric material 68 have a lower C content (i.e., C depletion) as compared to the remaining portions of the second dielectric material 68. When non-C containing dielectric materials are employed, the damaged sidewalls 68' may be characterized as being porous.

Figure 5:
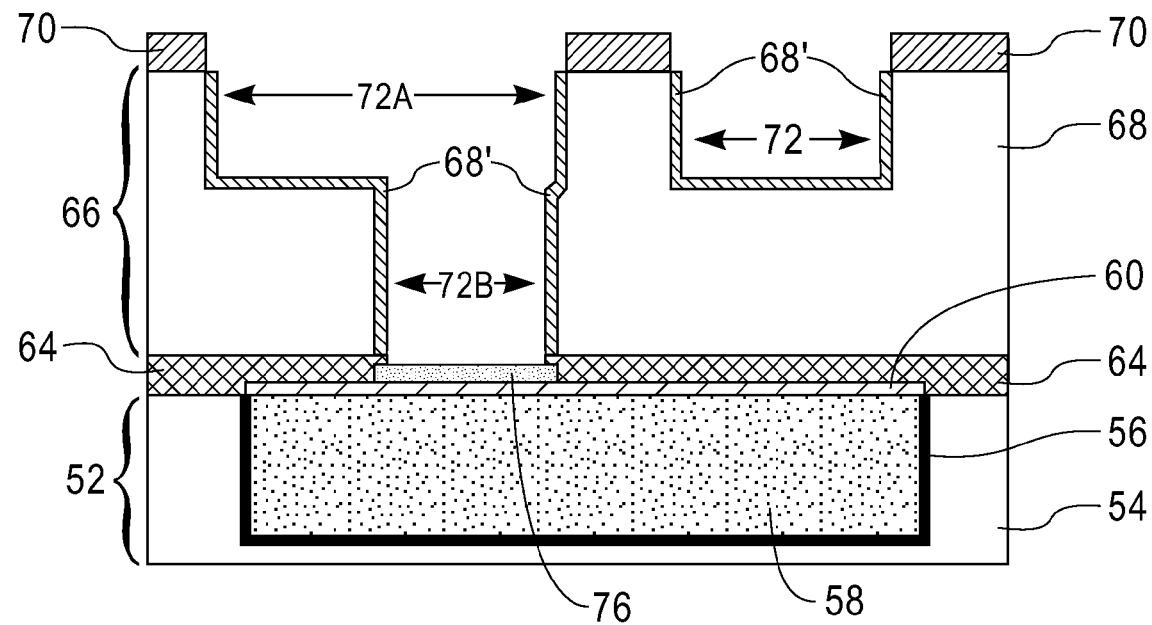

FIG. 5 illustrates the next step of the present invention in which a second metallic capping layer 76 is selectively formed on the exposed surface of the first metallic capping layer 60. In accordance with the present invention, the second metallic capping layer 76 is comprised of a different metal than which is present in the first metallic capping layer 60. More particularly, the second metallic capping layer 76 is comprised of one of Ru, Rh, Ir, Pd, Pt, Ag, Au and alloys thereof. In a highly preferred embodiment of the present invention, the second metallic capping layer 76 is comprised of Ru. In some embodiments, it is preferred to use a Ru-containing second metallic capping layer 76 with a Co-containing first metallic capping layer 60.

The second metallic capping layer 76 has a thickness that is typically within a range from about 2 to about 50 nm, with a thickness range from about 5 to about 10 nm being even more typical. The second metallic capping layer 76 is typically, but not necessary always, formed utilizing a selective deposition process including for example, a catalytic plating process, an electroless plating process, chemical vapor deposition (CVD), and atomic layer deposition (ALD).

Next, the structure shown in FIG. 5 is subjected to a cleaning step which removes the damaged layer 68' from the sidewalls of the openings. The resultant structure which is formed after performing the cleaning step is shown, for example, in FIG. 6. The cleaning process employed in the present invention comprises any cleaning process which is capable of removing the damaged sidewalls 68' of the structure shown in FIG. 5. Examples of such cleaning processes that are capable of removing the damaged sidewalls 68' from within the openings include a wet clean such as contacting with DHF (i.e., dilute hydrofluoric acid) or DI (i.e., deionized water), a dry clean such as contacting with a gas or plasma of $NH_3$, $N_2$, $H_2$ or silane, and any combination thereof. Preferably, contacting with DHF is employed. The cleaning process has good removing selectivity between damaged dielectric and bulk dielectric (>100:1), and does not react with the second metallic capping layer 76.

Figure 6:
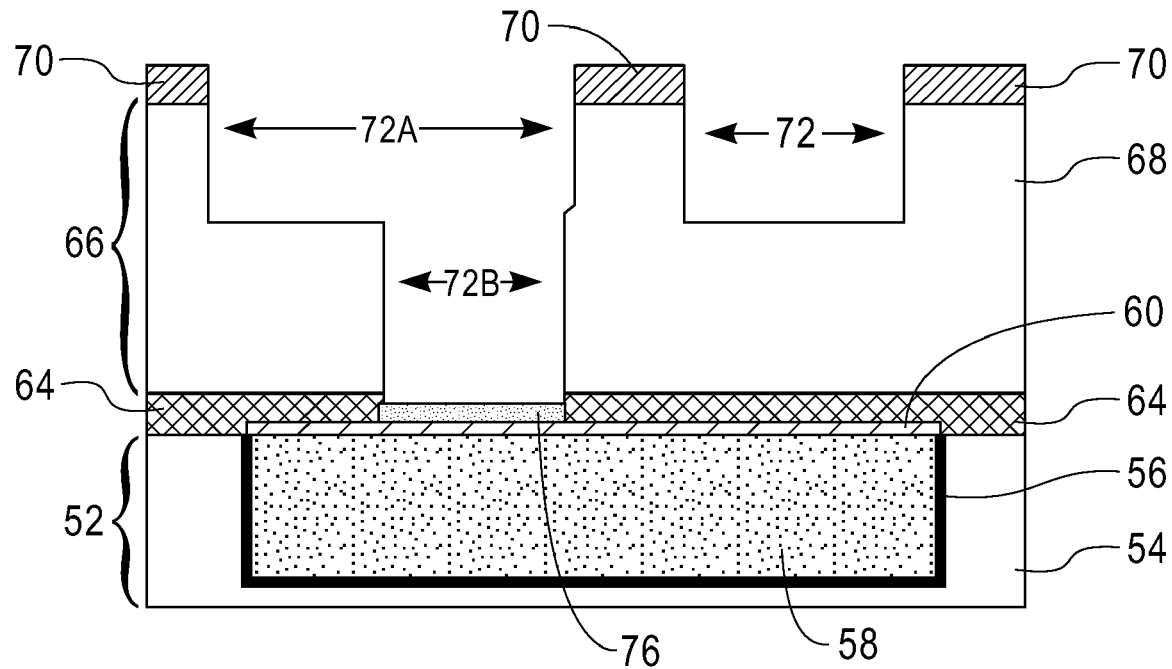
Figure 7:
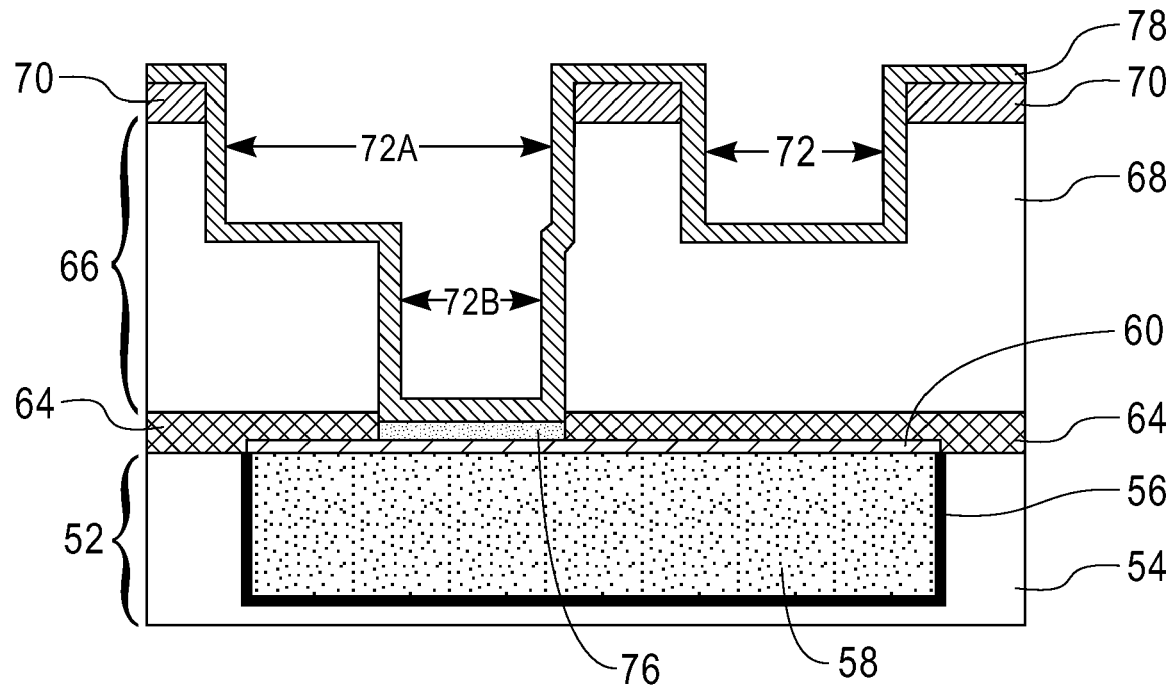

FIG. 7 illustrates the structure of FIG. 6 after a diffusion barrier 78, which represents a second diffusion barrier used in the invention, is formed on all exposed surfaces (horizontal and vertical) of the structure shown in FIG. 6. In accordance with the present invention, the diffusion barrier 78 comprises Ta, TaN, Ti, TiN, Ru, RuN, RuTa, RuTaN, W, WN or any other material that can serve as a barrier to prevent a conductive material from diffusing there through. Combinations of these materials are also contemplated forming a multilayered stacked diffusion barrier. The diffusion barrier 78 is formed utilizing a deposition process such as, for example, atomic layer deposition (ALD), chemical vapor deposition (CVD), plasma enhanced chemical vapor deposition (PECVD), physical vapor deposition (PVD), sputtering, chemical solution deposition, or plating.

The thickness of the diffusion barrier 78 may vary depending on the number of material layers within the barrier, the technique used in forming the same as well as the material of the diffusion barrier itself. Typically, the diffusion barrier 78 has a thickness from about 4 to about 40 nm, with a thickness from about 7 to about 20 nm being even more typical.

In some embodiments, an adhesion/plating seed layer (not specifically shown) is also formed atop the diffusion barrier 78; in embodiments when the adhesion/plating seed layer is used, reference numeral 78 shown in FIG. 7 represents a material stack including both the diffusion barrier and the optional adhesion/plating seed layer. When employed, the optional adhesion/plating seed layer is comprised of a metal or metal alloy from Group. VIIIA of the Periodic Table of Elements. Examples of suitable Group VIIIA elements for the adhesion/plating seed layer include, but are not limited to Ru, TaRu, Ir, Rh, Pt, Pd and alloys thereof. In some embodiments, it is preferred to use Ru, Ir or Rh as the optional adhesion/plating seed layer. The optional adhesion/plating seed layer is formed by a conventional deposition process including, for example, chemical vapor deposition (CVD), plasma enhanced chemical vapor deposition (PECVD)), atomic layer deposition (ALD), plating, sputtering and physical vapor deposition (PVD). The thickness of the optional adhesion/plating seed layer may vary depending on number of factors including, for example, the compositional material of the adhesion/plating seed layer and the technique that was used in forming the same. Typically, the optional adhesion/plating seed layer has a thickness from about 0.5 to about 10 nm, with a thickness of less than 6 nm being even more typical.

Figure 8:
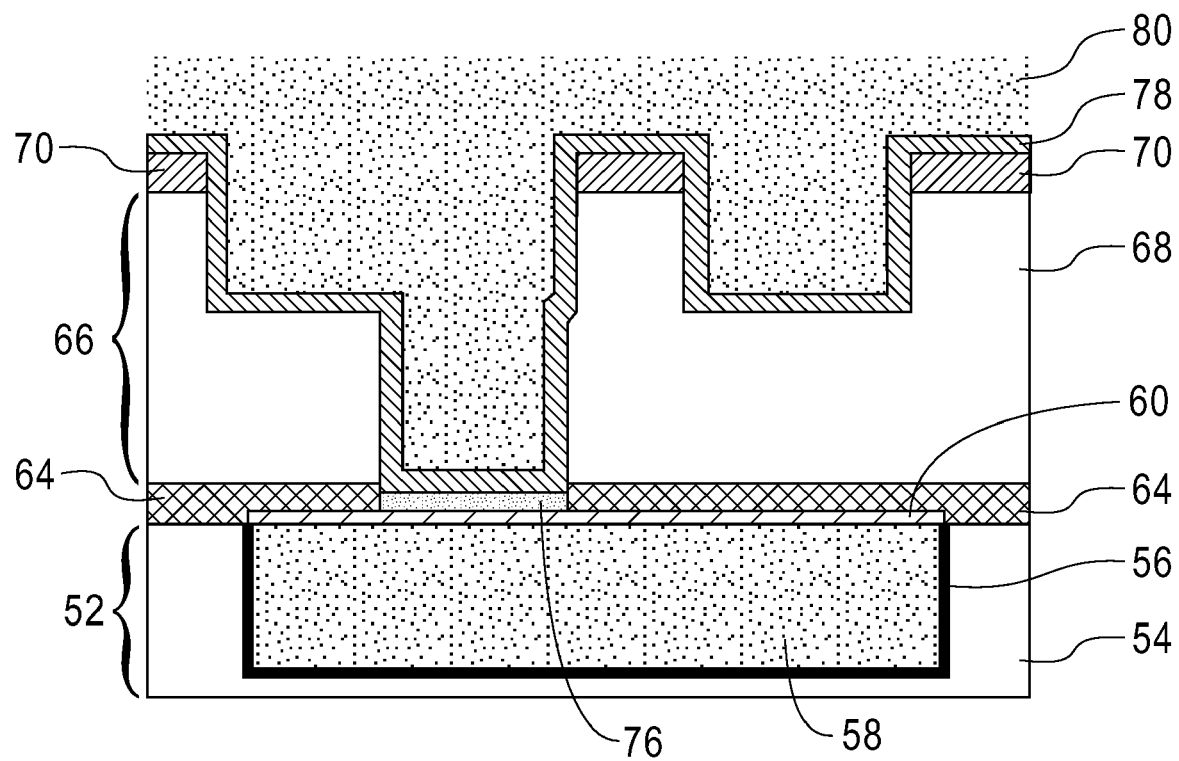

Reference is now made to FIG. 8 which illustrates the structure of FIG. 7 after filling the via and line openings with an interconnect conductive material 80. The interconnect conductive material 80 may comprise the same or different, preferably the same, conductive material (with the proviso that the conductive material is not polysilicon) as that of the conductive feature 58 within the first dielectric material 54. Preferably, Cu, Al, W or alloys thereof are used, with Cu or AlCu being most preferred. The interconnect conductive material 80 is formed utilizing the same deposition processing as described above in forming the conductive feature 58 within the first dielectric material 54.

After providing the structure shown in FIG. 8, the structure is subjected to a conventional planarization process such as, for example, chemical mechanical planarization and/or grinding. The planarization process removes various materials that are located atop the second dielectric material 68 of the second interconnect level 66. The planarized structure is shown, for example, in FIG. 9. It is noted that in FIG. 9, the conductive material 80 and the diffusion barrier 78, each have an upper surface that is coplanar with the second dielectric material 68.

Figure 9:
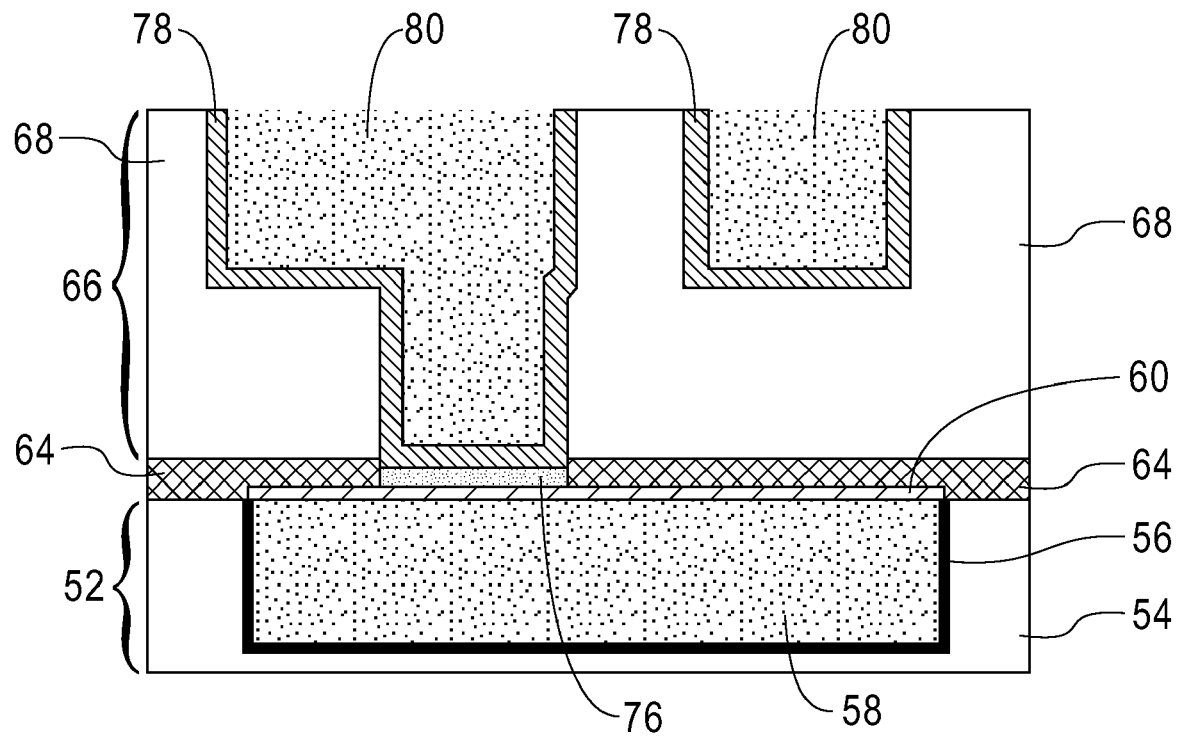
Figure 10:
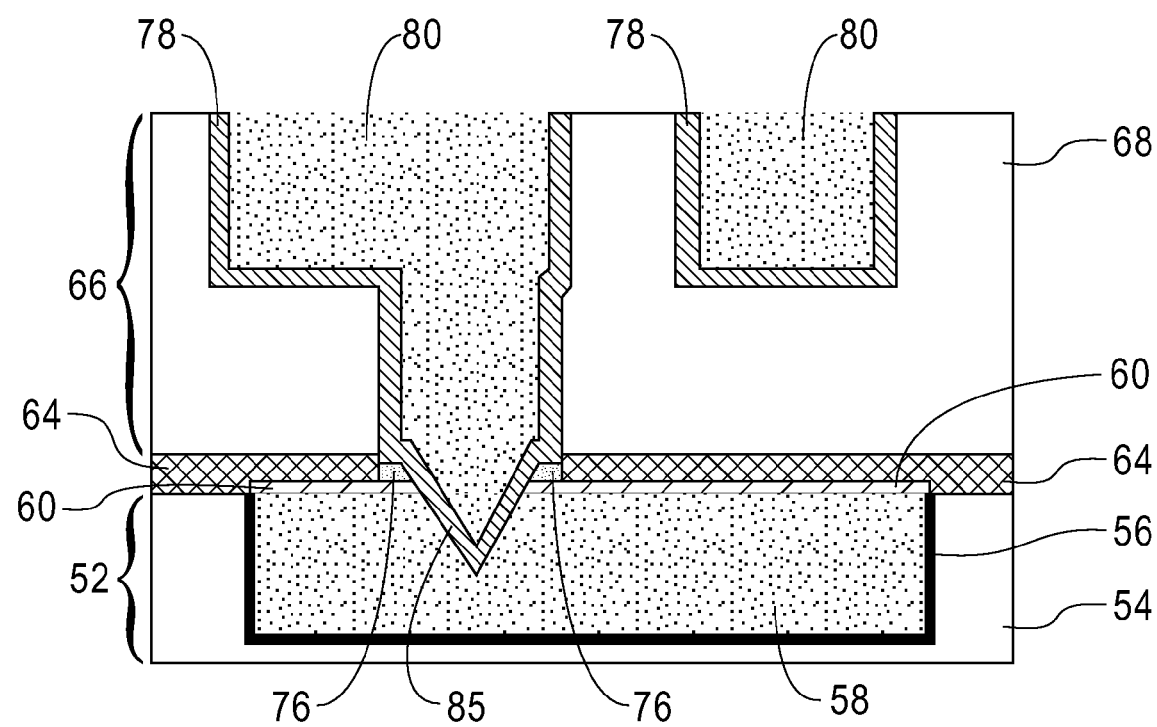
FIG. 10 is a pictorial representation (through a cross sectional view) depicting an alternative interconnect structure that can be formed utilizing an alternative embodiment of the present invention.

It is noted that the structure shown in FIG. 9 represents one embodiment of the present invention. In this embodiment of the present invention, no via gouging feature is formed into the conductive feature 58 within the first dielectric material 54. Since no via gouging feature is formed, the diffusion barrier 78, the second metallic capping layer 76 and the first metallic capping layer 60 remain intact at the lower region of the via opening 72B. In this embodiment of the invention, the conductive material 80 within the second dielectric material 68 is separated from the conductive feature 58 within the first dielectric material by a material stack including the diffusion barrier 78, the second metallic capping layer 76 and the first metallic capping layer 60. It is also noted that in the inventive structure, the second metallic capping layer 76 is located beneath the via opening.

Reference is now made to FIG. 10 which illustrates an alternative embodiment of the invention in which a via gouging feature 85 is formed into the conductive feature 58 within the first dielectric material 54. Since a via gouging feature is formed, a central portion of the second metallic capping layer 76 and an underlying portion of the first metallic capping layer 60 that lie within the dimensions of the via opening are removed, while other portions of the second metallic capping layer 76 and the first metallic capping layer 60 remain intact in areas outside the dimensions of the via opening. In this embodiment of the invention, the conductive material 80 within the second dielectric material 68 is separated from the conductive feature 58 within the first dielectric material by the diffusion barrier 78.

The structure shown in FIG. 10 is formed by first providing the structure shown in FIG. 5. Prior to forming the diffusion barrier 78, an Ar sputtering process which punches through the underlying conductive feature 58 (i.e., by removing a portion of the conductive material within the conductive feature 58) so as to create a gouging feature (or anchoring area) within the conductive feature 58. The Ar sputtering process utilized in forming the gouging feature comprises any conventional Ar sputtering process that is typically used in interconnect technology to form such a feature. By way of illustration, Ar sputtering can be performed utilizing the following non-limiting conditions: gas flow of 20 sccm Ar, temperature of 25° C., bias of top electrode of 400 KHz and 750 W, table bias of 13.6 MHz and 400 W, and a process pressure of 0.6 mtorr. While Ar is shown for purpose of illustration, any other gas such as He, Ne, Xe, $N_2$, $H_2$, $NH_3$, $N_2H_2$, or mixtures thereof can also be used for the sputtering process.

In some embodiments, residues from the Ar sputtering process may be formed on the damaged sidewalls 68' of the second dielectric material 68. The residues are undesirable since that may result in device reliability problems if left within the interconnect structure. The residues are typically metallic-containing residues which are based on the conductive material within the conductive feature. These metallic residues are removed during a subsequent cleaning process which also removes the damaged sidewalls of the second dielectric material 68.

In some embodiments (not shown), a metallic interfacial layer can be selectively formed on the exposed upper surface of the remaining conductive feature 58 within the via gouging feature. The metallic interfacial layer is formed utilizing any conventional deposition process including, for example, CVD, PECVD, chemical solution deposition, evaporation, metalorgano deposition, ALD, or plating (electroless or electro). The thickness of the metallic interfacial layer may vary depending on the exact metallic interfacial material used as well as the deposition technique that was used in forming the same. Typically, the metallic interfacial layer has a thickness from about 0.5 to about 40 nm, with a thickness from about 1 to about 10 nm being even more typical. The metallic interfacial layer comprises a metallic barrier material such as, for example, Co, TaN, Ta, Ti, TiN, Ru, Ir, Au, Rh, Pt, Pd or Ag. Alloys of such materials are also contemplated.

After forming the via gouging feature, the structure is subjected to the same processing steps as illustrated in FIGS. 6-9 so as to provide the structure shown in FIG. 10.

While the present invention has been particularly shown and described with respect to preferred embodiments thereof, it will be understood by those skilled in the art that the foregoing and other changes in forms and details may be made without departing from the spirit and scope of the present invention. It is therefore intended that the present invention not be limited to the exact forms and details described and illustrated, but fall within the scope of the appended claims.

What is claimed is:

1. A semiconductor structure comprising:
a first interconnect level including a first dielectric material having at least one conductive feature embedded therein, said at least one conductive feature has an upper surface in which at least some portions thereof are protected by an overlying first metallic capping layer, wherein said upper surface of said at least one conductive feature is coplanar with an upper surface of said first dielectric material and wherein said first metallic capping layer has an upper surface that is located above said upper surface of the first dielectric material;
a dielectric capping layer located on said upper surface of said first dielectric material and said upper surface of said first metallic capping layer;
a second interconnect level including a second dielectric material having at least one conductively filled opening punched through said dielectric capping layer and located on said upper surface of said first metallic capping layer; and
a second metallic capping layer located only at a bottom portion of said at least one conductively filled opening and on at least some portion of the upper surface of said first metallic capping layer, said second metallic capping layer is comprised of a different metal than said first metallic capping layer.

2. The semiconductor structure of claim 1 wherein said first and second dielectric materials comprise the same or different low k dielectric having a dielectric constant of about 4.0 or less.

3. The semiconductor structure of claim 1 wherein said first and second dielectric materials comprise the same or different porous low k dielectric having a dielectric constant of about 2.8 or less.

4. The semiconductor structure of claim 1 wherein said first and second dielectric materials are the same or different and comprise at least one of $SiO_2$, a silsesquioxane, a C doped oxide that include atoms of Si, C, O and H, and a thermosetting polyarylene ether.

5. The semiconductor structure of claim 1 wherein said dielectric capping layer comprises one of SiC, $Si_4NH_3$, $SiO_2$, a carbon doped oxide, and a nitrogen and hydrogen doped silicon carbide SiC(N,H).

6. The semiconductor structure of claim 1 wherein said first metallic capping layer comprises one of Co, Ir and Ru in pure form or alloyed with at least one of W, B, P, Mo and Re.

7. The semiconductor structure of claim 6 wherein said first metallic capping layer is Co-containing.

8. The semiconductor structure of claim 1 wherein said second metallic capping layer comprises one of Ru, Rh, Ir, Pd, Pt, Ag and Au in pure or alloyed form.

9. The semiconductor structure of claim 8 wherein said second metallic capping layer is Ru-containing.

10. The semiconductor structure of claim 1 wherein said at least one conductive feature and said at least one conductively filled opening are comprised of the same or different conductive material.

11. The semiconductor structure of claim 1 wherein said at least one conductive feature and said at least one conductively filled opening are comprised of Cu or a Cu-containing alloy.

12. The semiconductor structure of claim 1 wherein said at least one conductive feature is a non-via gouged feature.

13. The semiconductor structure of claim 1 wherein said at least one conductive feature includes a via gouged feature.

* * * * *